United States Patent
Saito

(10) Patent No.: US 8,822,247 B2
(45) Date of Patent: Sep. 2, 2014

(54) OPTICAL SEMICONDUCTOR ELEMENT AND MANUFACTURING METHOD OF THE SAME

(75) Inventor: Tatsuma Saito, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 151 days.

(21) Appl. No.: 13/412,217

(22) Filed: Mar. 5, 2012

(65) Prior Publication Data

US 2012/0228670 A1 Sep. 13, 2012

(30) Foreign Application Priority Data

Mar. 7, 2011 (JP) ................................. 2011-048786

(51) Int. Cl.
  *H01L 33/30* (2010.01)
  *H01L 33/00* (2010.01)
  *H01L 33/20* (2010.01)
  H01L 33/22 (2010.01)
  H01L 33/32 (2010.01)

(52) U.S. Cl.
  CPC ............... *H01L 33/007* (2013.01); H01L 33/22 (2013.01); H01L 33/32 (2013.01); *H01L 33/20* (2013.01); *H01L 33/0079* (2013.01)
  USPC ................ 438/43; 438/28; 257/98; 257/103; 257/E33.023; 257/E33.074

(58) Field of Classification Search
  CPC ... H01L 33/24; H01L 33/005; H01L 33/0075; H01L 33/08; H01L 2933/0083
  USPC ............... 438/43, 40, 713, 718; 257/E33.007
  See application file for complete search history.

(56) References Cited

U.S. PATENT DOCUMENTS

| | | | | |
|---|---|---|---|---|
| 7,030,421 B2* | 4/2006 | Okuyama et al. | | 257/89 |
| 7,355,210 B2* | 4/2008 | Ou et al. | | 257/95 |
| 2002/0076593 A1* | 6/2002 | Helfinstine et al. | | 429/30 |
| 2005/0045894 A1* | 3/2005 | Okuyama et al. | | 257/95 |
| 2007/0085102 A1* | 4/2007 | Orita | | 257/98 |
| 2008/0131987 A1* | 6/2008 | Horino et al. | | 438/43 |
| 2009/0087994 A1* | 4/2009 | Lee et al. | | 438/704 |
| 2011/0057219 A1* | 3/2011 | Lai | | 257/98 |
| 2011/0233581 A1* | 9/2011 | Sills et al. | | 257/98 |

FOREIGN PATENT DOCUMENTS

| | | | |
|---|---|---|---|
| JP | 2007-067182 A | 3/2007 |
| JP | 2007-521641 A | 8/2007 |
| JP | 2009-238879 A | 10/2009 |
| JP | 2010-157551 A | 7/2010 |

OTHER PUBLICATIONS

Neil W Ashcroft and N. David Mermin, Solid State Physics, 1976 by Holt, Rinehart and Winston, pp. 92-93.*

* cited by examiner

*Primary Examiner* — William F Kraig
*Assistant Examiner* — Pavel Ivanov
(74) *Attorney, Agent, or Firm* — Holtz Holtz Goodman & Chick PC

(57) ABSTRACT

An optical semiconductor element and a manufacturing method thereof that can improve the light extraction efficiency with maintaining the yield. The manufacturing method includes forming a plurality of recesses arranged at equal intervals along a crystal axis of a semiconductor film in a surface of the semiconductor film; and performing an etching process on the surface of the semiconductor film, thereby forming a plurality of protrusions arranged according to the arrangement form of the plurality of recesses and deriving from the crystal structure of the semiconductor film in the surface of the semiconductor film.

4 Claims, 7 Drawing Sheets

MICRO-CONES FORMED BY A CONVENTIONAL PROCESS

MICRO-CONE FORMED BY THE PROCESS
OF THE PRESENT EMBODIMENT

OPTICAL SEMICONDUCTOR ELEMENT AND MANUFACTURING METHOD OF THE SAME

BACKGROUND OF THE INVENTION

1. Field of the Invention

The present invention relates to an optical semiconductor element such as a light emitting diode and a manufacturing method thereof.

2. Description of the Related Art

Optical semiconductor elements such as light emitting diodes have been made to have high output power due to recent years' advance in technology. Accordingly the amount of heat generated in the optical semiconductor element has increased, and hence there are the problems of reduction in luminous efficiency, degradation of a semiconductor film, and the like. In order to solve them, a configuration is taken where the growth substrate of relatively low thermal conductivity such as a sapphire substrate used for semiconductor-film crystal growth is removed and where instead a substrate of relatively high thermal conductivity is used to support the semiconductor film.

Further, a plurality of protrusions deriving from the crystal structure of the semiconductor film are formed by performing chemical etching on the surface of the semiconductor film exposed by removing the sapphire substrate, and thereby a light extraction structure is formed in the light extraction surface. By this means, the portion of light that is totally reflected at the light extraction surface can be reduced, and hence the light extraction efficiency can be improved. For example, by performing wet etching with an alkali solution on the C-plane of a GaN-based semiconductor film, a plurality of six-sided pyramid-shaped protrusions deriving from a wurtzite-type crystal structure can be formed in the C-plane. The protrusions deriving from a crystal structure are referred to as micro-cones.

PATENT LITERATURE

PTL1: Japanese Patent Kokai No. 2007-067182
PTL2: Japanese Patent Kokai No. 2010-157551
PTL3: Japanese translation of PCT application No. 2007-521641.
PTL4: Japanese Patent Kokai No. 2009-238879

SUMMARY OF THE INVENTION

FIG. 1 is an electron microscope photograph of micro-cones formed in a surface of GaN using a conventional process. When a plurality of micro-cones are formed in a surface of a semiconductor film by conventional chemical etching, the sizes, pitches, and arrangement of micro-cones are irregular as shown in FIG. 1. This is because crystal planes different in etching speed exist randomly in the surface of the semiconductor film due to crystal defects, surface evenness, or the like of the semiconductor film.

As such, if micro-cones irregular in size, pitch, and arrangement are formed, the following problem occurs. When micro-cones come into contact with each other in the forming process of micro-cones, these may encroach on each other to be deformed or stop growing, thus forming flat-bottomed gaps between the micro-cones. In this case, facets (slopes) which are advantageous in light extraction are less likely to emerge, and thus improvement in the light extraction efficiency is prevented.

In order to improve the light extraction efficiency, the average size of micro-cones needs to be enlarged to a certain degree, and the average size of micro-cones is usually adjusted through etching time. However, with the conventional process, it is difficult to avoid the occurrence of micro-cones of sizes remarkably larger than the average size, and thus through holes are formed in the semiconductor film due to the micro-cones of large sizes, resulting in a reduction in yield. As such, with the conventional process, it is difficult to improve the light extraction efficiency to a maximum degree with maintaining the yield.

The present invention has been made in view of the above facts, and an object thereof is to provide an optical semiconductor element and a manufacturing method thereof that can improve the light extraction efficiency with maintaining the yield.

According to the present invention, there is provided a manufacturing method of an optical semiconductor element including a semiconductor film having a crystal structure of a hexagonal system. The manufacturing method includes a step of forming a plurality of recesses arranged at equal intervals along a crystal axis of the semiconductor film in a surface of the semiconductor film; and a step of performing an etching process on the surface of the semiconductor film, thereby forming a plurality of protrusions arranged according to the arrangement form of the plurality of recesses and deriving from the crystal structure of the semiconductor film in the surface of the semiconductor film.

Further, according to the present invention, there is provided an optical semiconductor element including a semiconductor film having a crystal structure of a hexagonal system. The semiconductor film has a plurality of six-sided pyramid-shaped protrusions deriving from the crystal structure of the semiconductor film in its surface, and the plurality of protrusions are formed to form the closest packed arrangement along a crystal axis of the semiconductor film.

According to the optical semiconductor element and its manufacturing method of the present invention, the light extraction efficiency can be improved with maintaining the yield.

DETAILED DESCRIPTION OF THE INVENTION

Figure 1:
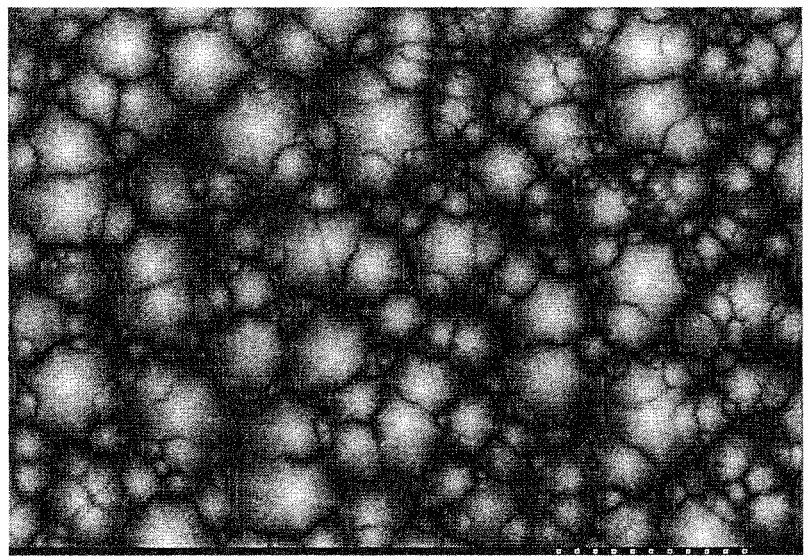
FIG. 1 is an electron microscope photograph showing micro-cones formed by a conventional process.

Embodiments of the present invention will be described below with reference to the drawings. The same reference numerals are used to denote substantially the same or equivalent constituents and parts throughout the figures.

Embodiment 1

FIGS. 2A to 2D and FIGS. 3A to 3D are cross-sectional views showing the manufacturing method of an optical semiconductor element according to Embodiment 1 of the present invention.
(Formation of a Semiconductor Film)

A C-plane sapphire substrate on which $Al_xIn_yGa_zN$ ($0 \leq x \leq 1$, $0 \leq y \leq 1$, $0 \leq z \leq 1$, $x+y+z=1$) having a crystal structure of a wurtzite type that is a kind of hexagonal system can be grown is used as a growth substrate 10. An n-type semiconductor layer 22, an active layer 24, and a p-type semiconductor layer 26 that are made of $Al_xIn_yGa_zN$ are sequentially crystal-grown one over another on the growth substrate 10 by a metal organic chemical vapor deposition (MOCVD) method to obtain a semiconductor film 20.

The n-type semiconductor layer 22 comprises a buffer layer made of GaN, an underlying GaN layer, and an n-type GaN layer. The growth substrate 10 is placed in an MOCVD apparatus, and heat treatment for about 10 minutes is performed in a hydrogen atmosphere at a substrate temperature of about 1,000° C. (thermal cleaning). Then, at a growth temperature of 500° C., TMG (trimethylgallium) (flow rate: 10.4 μmol/min) and $NH_3$ (flow rate: 3.3 LM) are supplied for about 3 minutes, thereby forming the low-temperature buffer layer (not shown) made of GaN. Subsequently, the substrate temperature is raised to 1,000° C. and maintained for about 30 seconds to crystallize the low-temperature buffer layer. Then, with the growth temperature kept at 1,000° C., TMG (flow rate: 45 μmol/min) and $NH_3$ (flow rate: 4.4 LM) are supplied for about 20 minutes, thereby forming the underlying GaN layer (not shown) of about 1 μm thickness. Then, with the growth temperature kept at 1,000° C., TMG (flow rate: 45 μmol/min), $NH_3$ (flow rate: 4.4 LM), and $SiH_4$ (flow rate: $2.7 \times 10^{-9}$ μmol/min) are supplied for about 120 minutes, thereby forming the n-type GaN layer of about 7 μm thickness. By this process, the n-type semiconductor layer 22 is formed on the growth substrate 10.

Then, the active layer 24 having a multi-quantum well structure where five pairs of an InGaN well layer and a GaN barrier layer are laid one over another is formed on the n-type semiconductor layer 22. At a growth temperature of about 700° C., TMG (flow rate: 3.6 μmol/min), TMI (trimethylindium) (flow rate: 10 μmol/min), and $NH_3$ (flow rate: 4.4 LM) are supplied for 33 seconds, thereby forming an InGaN well layer of about 2.2 nm thickness. Subsequently, TMG (flow rate: 3.6 μmol/min) and $NH_3$ (flow rate: 4.4 LM) are supplied for 320 seconds, thereby forming a GaN barrier layer of about 15 nm thickness. By repeating this process five periods, the active layer 24 is formed.

Figure 2A:
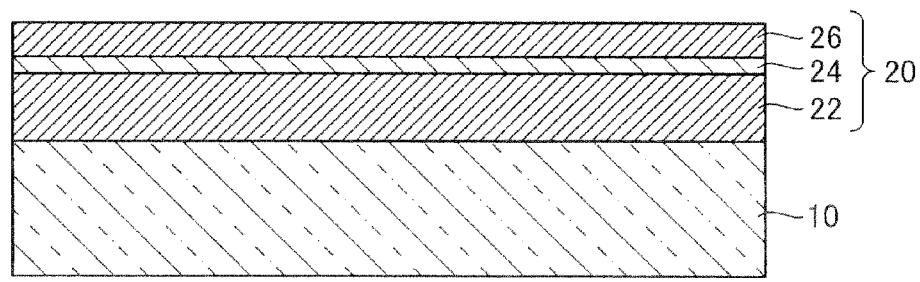
FIGS. 2A to 2D are cross-sectional views showing the manufacturing method of an optical semiconductor element according to an embodiment of the present invention.

The p-type semiconductor layer 26 is formed by crystal-growing sequentially, for example, a p-type AlGaN clad layer and a Mg-doped p-type GaN layer. At a growth temperature of 870° C., TMG (flow rate: 8.1 μmol/min), TMA (trimethylaluminum) (flow rate: 7.5 μmol/min), $NH_3$ (flow rate: 4.4 LM), and $Cp_2Mg$ (flow rate: $2.9 \times 10^{-7}$ μmol/min) are supplied for 5 minutes, thereby forming the p-type AlGaN clad layer of about 40 nm thickness on the active layer 24. Subsequently, with maintaining the growth temperature, TMG (flow rate: 18 μmol/min), $NH_3$ (flow rate: 4.4 LM), and $Cp_2Mg$ (flow rate: $2.9 \times 10^{-7}$ μmol/min) are supplied for 7 minutes, thereby forming the p-type GaN layer of about 150 nm thickness on the p-type AlGaN clad layer. By this process, the p-type semiconductor layer 26 is formed on the active layer 24 (FIG. 2A).
(Formation of Element Division Grooves)

Figure 2B:
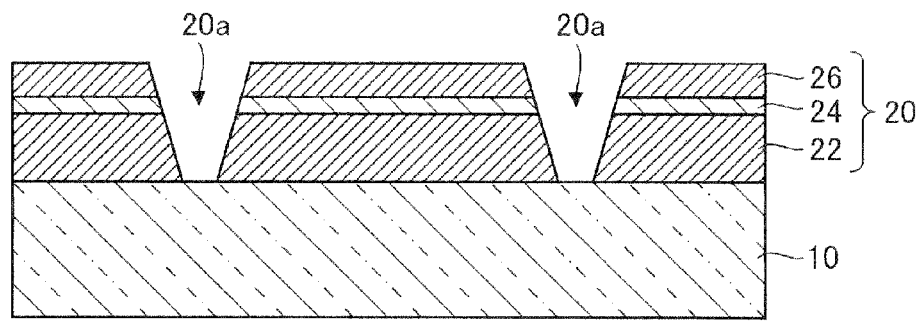

The semiconductor film 20 is etched from the surface side of the p-type semiconductor layer 26 to form element division grooves 20a along predetermined element division lines. Specifically, a resist mask (not shown) having openings extending along the element division lines is formed on the surface of the p-type semiconductor layer 26. Then, the wafer is put in a reactive ion etching (RIE) apparatus, and the semiconductor film 20 is etched via the resist mask by dry etching using $Cl_2$ plasma to form the element division grooves 20a in the semiconductor film 20 (FIG. 2B).
(Formation of a Protective Film and P-Electrodes)

A protective film 28 made of an insulator is formed to cover the side surfaces of the semiconductor film 20 exposed by forming the element division grooves 20a. Specifically, a resist mask (not shown) is formed which has openings over the side surfaces of the semiconductor film 20 exposed by forming the element division grooves 20a. Then, a $SiO_2$ film to constitute the protective film 28 is formed over the semiconductor film 20 by a sputtering method or the like. Then, the resist mask is removed with a resist remover to lift off unnecessary portions of the $SiO_2$ film, thereby patterning the protective film 28. Note that in order to avoid the occurrence of cracks or peeling-off in the protective film 28, it is desirable that the protective film 28 should not extend to the growth substrate 10. Further, the protective film 28 may be formed of another insulator such as $Si_3N_4$.

Figure 2C:
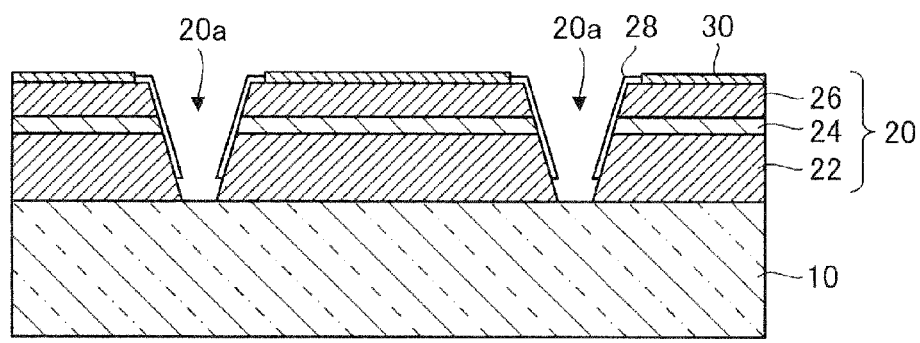

Next, p-electrodes 30 are formed on the surface of the p-type semiconductor layer 26. Specifically, a resist mask (not shown) having openings over the p-electrode forming regions on the p-type semiconductor layer 26 is formed. Then, Pt (1 nm in thickness), Ag (150 nm in thickness), Ti (100 nm in thickness), Pt (100 nm in thickness), and Au (200 nm in thickness) that are electrode materials are sequentially deposited over the p-type semiconductor layer 26 by, e.g., an electron beam evaporation method. Then, the resist mask is removed to lift off unnecessary portions of the electrode materials, thereby forming the p-electrodes 30 on the p-type semiconductor layer 26. The p-electrode 30 functions also as a light reflective layer that reflects light emitted from the active layer 24 toward the light extraction surface. Although in this embodiment the p-electrodes 30 are formed after the formation of the protective film 28, the protective film 28 may be formed after the formation of the p-electrodes 30. In this case, a resist mask is used as needed (FIG. 2C).
(Formation of a Support Substrate)

Figure 2D:
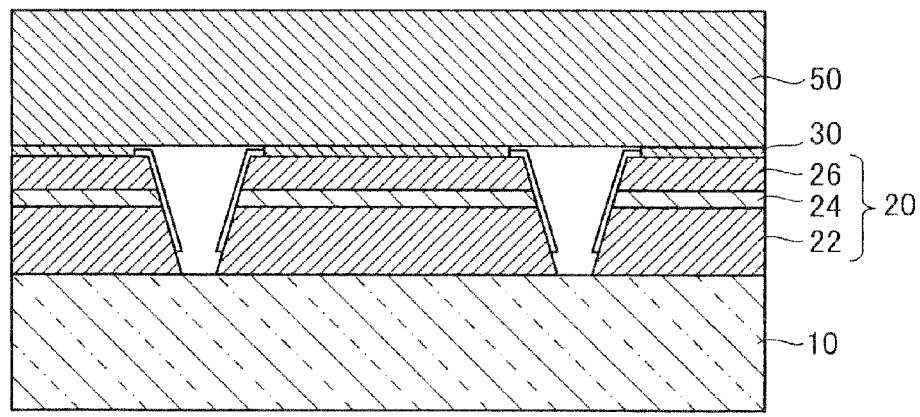

A conductive support substrate 50 having such a mechanical strength that it can support the semiconductor film 20 is prepared. A Si substrate made conductive by dopant implantation can be used as the support substrate 50. A eutectic bonding layer (not shown) made of AuSn of about 1 μm thickness is formed on the surface of the support substrate 50 by a sputtering method. Then, using a wafer bonder apparatus, the p-electrodes 30 on the growth substrate 10 side and the bonding layer on the support substrate 50 side are put against each other, and heat and pressure are applied thereto so that the support substrate 50 is bonded to the semiconductor film 20 (FIG. 2D).
(Removal of the Growth Substrate)

Figure 3A:
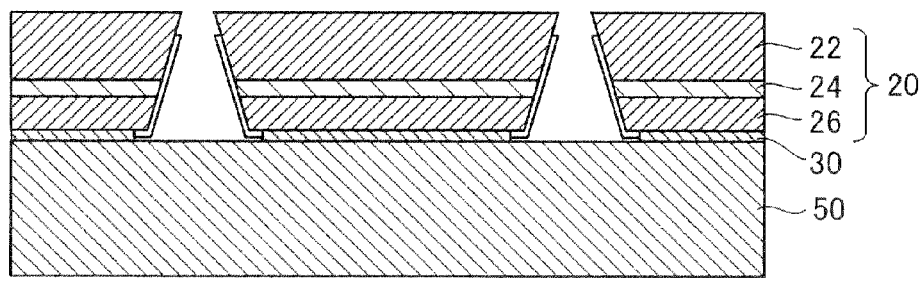
FIGS. 3A to 3D are cross-sectional views showing the manufacturing method of the optical semiconductor element according to the embodiment of the present invention.

The growth substrate 10 is separated from the semiconductor film 20 by a laser lift-off (LLO) method. An excimer laser can be used as a laser light source. Laser light irradiated from the back side of the growth substrate 10 reaches the semiconductor film 20 and decomposes GaN adjacent to the interface with the growth substrate 10 into metal Ga and $N_2$ gas. By this means, a gap is formed between the growth substrate 10 and the semiconductor film 20, and thereby the growth substrate 10 is separated from the semiconductor film 20. By the separation of the growth substrate 10, the n-type semiconductor layer 22 becomes exposed. The exposed surface of the n-type semiconductor layer 22 is the C-plane of a GaN semiconductor crystal, and six-sided pyramid-shaped micro-cones deriving from the crystal structure of GaN can be formed by wet etching using an alkali solution (FIG. 3A).

(Formation of a Light Extraction Structure)

Figure 3B:
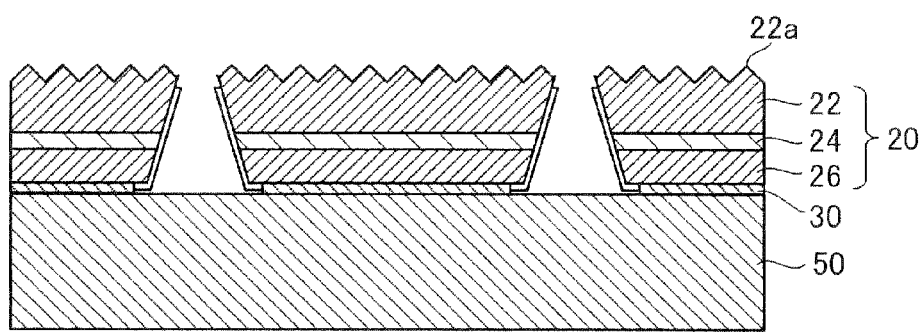

A wet etching process using an alkali solution is performed on the surface of the n-type semiconductor layer 22 exposed by removing the growth substrate 10 so as to form a plurality of micro-cones 22a in the surface of the n-type semiconductor layer 22. By this means, a light extraction structure is formed in the surface of the n-type semiconductor layer 22 (FIG. 3B).

FIGS. 4A to 4E show the surface of the n-type semiconductor layer 22 that is a light extraction surface, and are plan views showing the formation process of micro-cones 22a in this production process.

Figure 4B:
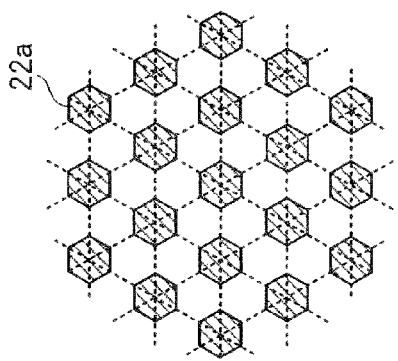
FIGS. 4A to 4E are plan views showing the formation process of micro-cones formed by the manufacturing method according to Embodiment 1 of the present invention.
Figure 4E:
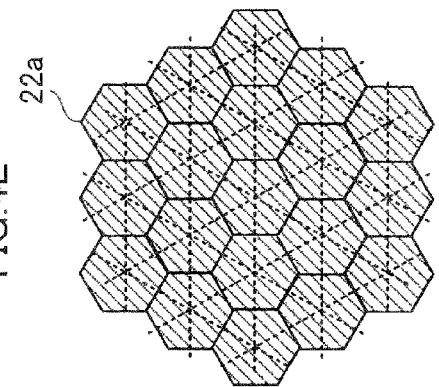
Figure 4A:
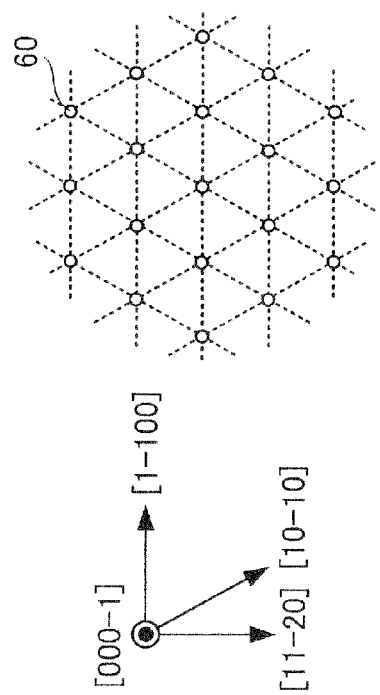

A plurality of recesses 60 arranged at equal intervals along a crystal axis of the semiconductor film 20 are formed in the exposed surface (C-plane) of the n-type semiconductor layer 22 exposed by removing the growth substrate 10 (FIG. 4A). Each recess 60 functions as an etching control point in the subsequent wet etching process, and the plurality of micro-cones 22a are arranged regularly according to the arrangement form of the recesses 60.

In order for each recess 60 to function as an etching control point effectively, the recess 60 is preferably greater than or equal to 500 nm and less than or equal to 1.5 µm in diameter and greater than or equal to 50 nm and less than or equal to 1.7 µm in depth. The shape of each recess 60 can be, for example, prismatic, pyramidal, cylindrical, conical (mortar-like), or hemispherical. A cylindrical, conical (mortar-like), or hemispherical shape is preferable where various crystal planes are exposed in the inside walls of the recess 60.

The arrangement form of the recesses 60 is as follows. That is, as shown in FIG. 4A, other recesses adjacent to any one recess are respectively placed at the vertexes of a regular hexagon, and the recesses 60 are arranged at equal intervals such that two opposite sides of the regular hexagon are parallel to the [1-100] direction of a crystal axis of the semiconductor film 20. In other words, the recesses 60 are arranged at equal intervals along the [1-100] direction of a crystal axis of the semiconductor film 20 and also at equal intervals along the [10-10] direction. Note that the direction of a crystal axis of the semiconductor film 20 can be recognized based on a cut called an orientation flat, usually formed in the growth substrate 10 and indicating the crystal orientation.

The micro-cone 22a is shaped like a six-sided pyramid having a bottom in a substantially regular hexagon, and the length of a perpendicular line joining two opposite sides of the regular hexagon forming the bottom coincides with the arrangement interval (pitch) of the recesses 60. Hence, the arrangement interval (pitch) of the recesses 60 should be set according to the size of micro-cones to be formed. The interval (pitch) of the recesses 60 can be, for example, greater than or equal to 1.0 µm and less than or equal to 5.5 µm. If the interval (pitch) of the recesses 60 is greater than the wavelength of light emitted from the active layer 24, micro-cones of sizes advantageous in light extraction can be formed. Further, the micro-cone has a slope at an angle of about 62° relative to the C-plane, and the interval of the recesses 60 and the height of the micro-cones formed coincide substantially.

Accordingly, the interval of the recesses 60 is set to be smaller than the thickness of the n-type semiconductor layer 22 so that a through hole reaching the active layer is not formed.

The plurality of recesses 60 can be formed by, for example, photolithography and dry etching. That is, after a resist mask having openings over the recess forming regions is formed on the surface of the n-type semiconductor layer 22, the n-type semiconductor layer 22 is etched via the above resist mask by reactive ion etching to form the recesses 60.

After the recesses 60 are formed, the wafer is immersed in an alkali solution such as TMAH (a tetramethylammonia solution) to wet etch the surface of the n-type semiconductor layer 22 that is the C-plane.

As described above, each of the recesses 60 functions as an etching control point in this wet etching process. That is, various crystal planes are exposed in the inside walls of each recess 60. Hence, etching speed in the recess 60 is lower as compared with the C-plane exposed at the principal surface of the n-type semiconductor layer 22. Hence, the etching of the C-plane, where etching speed is relatively high, starts preferentially first and progresses making a predetermined crystal plane be exposed. By this means, multiple six-sided pyramid-shaped micro-cones 22a with the formed point of each recess 60 as the apex start to be formed in the surface of the n-type semiconductor layer 22. That is, the micro-cones 22a are formed being arranged according to the arrangement form of the recesses 60. Because of their nature, all micro-cones 22a are formed to have such an orientation that two opposite sides of their bottom in a regular hexagon shape are parallel to the [1-100] direction of a crystal axis of the semiconductor film 20 (FIG. 4B). By making the recesses 60 in a cylindrical, conical (mortar-like), or hemispherical shape, the difference in etching speed between the recesses 60 and their neighboring regions becomes remarkable, and thus the function of the recess 60 as an etching control point can be further improved.

Figure 4D:
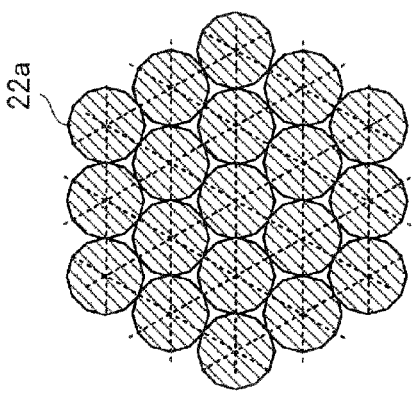
Figure 4C:
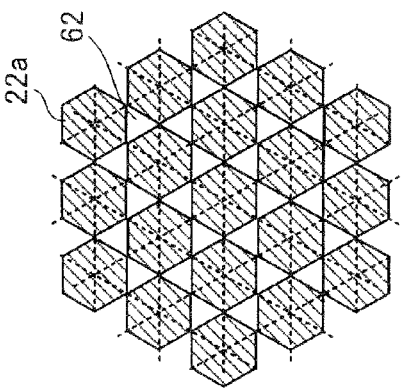

Each of the micro-cones 22a generated with the formed point of each recess 60 as the apex grows at substantially the same speed while the etching progresses. Because the micro-cones 22a are arranged at equal intervals according to the arrangement form of the recesses 60, the timing at which adjacent micro-cones come into contact with each other is substantially the same for the micro-cones (FIG. 4C).

Three faces surrounding each of triangle gaps 62 formed between the micro-cones 22a are crystal planes equivalent to each other, and hence the etching progresses without the crystal planes competing with each other. That is, the micro-cones do not encroach on each other to be deformed, and the gaps 62 do not remain as flat faces, either (FIG. 4D).

When the etching further progresses, multiple micro-cones 22a of substantially the same size form the closest packed arrangement, fully covering the entire surface of the n-type semiconductor layer 22. That is, the micro-cones 22a are formed with almost no gaps, and there are almost no portions remaining as flat faces. Further, because the micro-cones do not encroach on each other, the micro-cones are again shaped like a six-sided pyramid and maintain the shape until the end of the etching process (FIG. 4E). At this time, the regular hexagon of the bottom of the micro-cone 22a has two sides parallel to the [11-20] direction. Here, the closest packed arrangement refers to an arrangement where multiple micro-cones having a bottom in a regular hexagon shape are arranged without a gap on a plane as shown in FIG. 4E, a so-called honeycomb-like arrangement.

(Formation of N-Electrodes)

Figure 3C:
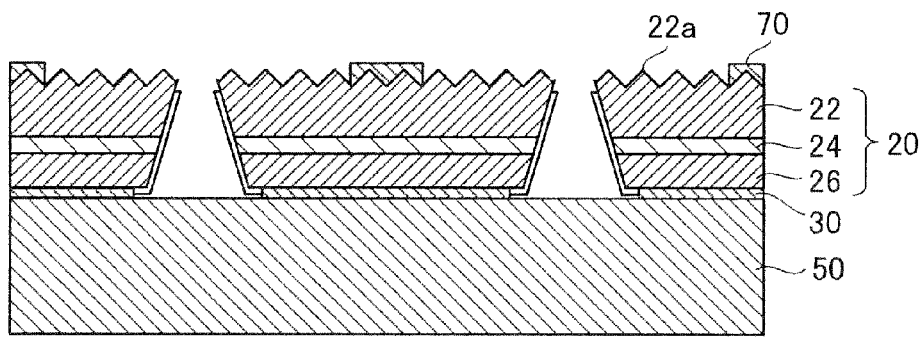

N-electrodes 70 are formed on the surface of the n-type semiconductor layer 22 in which the micro-cones are formed. Specifically, a resist mask (not shown) having openings over the n-electrode forming regions is formed on the surface of the n-type semiconductor layer 22. Subsequently, Ti and Al that are electrode materials are sequentially deposited on the surface of the n-type semiconductor layer 22 by an EB evaporation method or the like. Then, the resist mask is removed to lift off unnecessary portions of the electrode materials, thereby patterning the materials into the n-electrodes 70. Then, heat treatment at 500° C. for 20 seconds is performed to make the n-electrodes 70 alloyed. By this means, the ohmic property between the n-electrodes 70 and the n-type semiconductor layer 22 is improved (FIG. 3C).

(Separation of Elements)

Figure 3D:
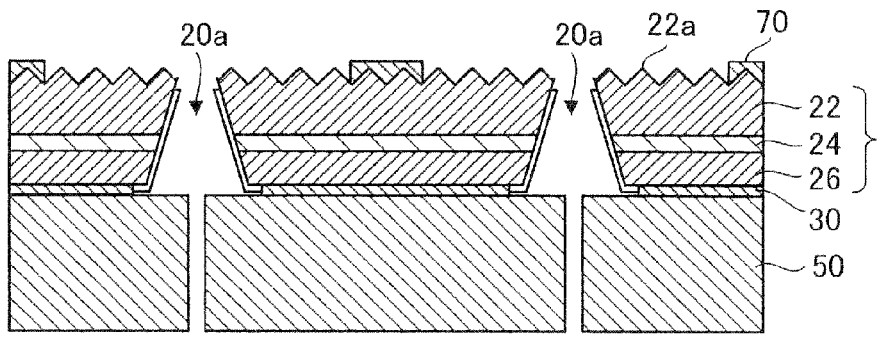

The wafer is cut and separated into chips of optical semiconductor elements. The support substrate 50 is cut by laser scribing, dicing, or the like along the element division grooves 20a, at the bottoms of which portions of the support substrate 50 are exposed, and the optical semiconductor elements are separated into chips. By undergoing the above process steps, the optical semiconductor elements are finished (FIG. 3D).

Figure 5:
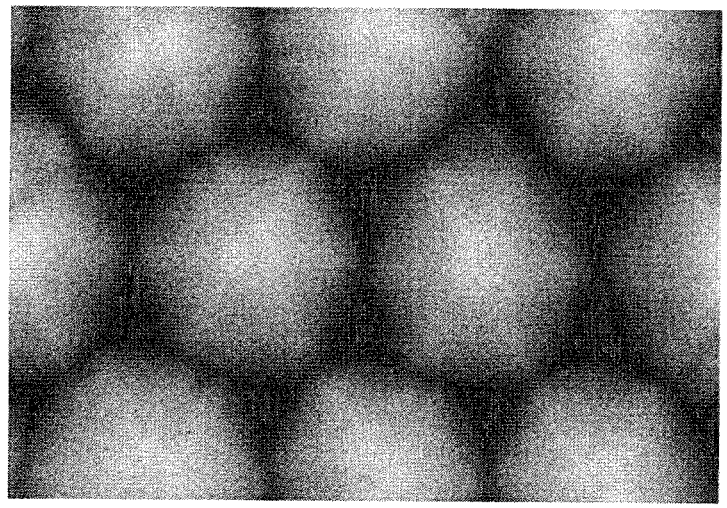
FIG. 5 is an electron microscope photograph showing micro-cones formed by the process according to the embodiment of the present invention.

FIG. 5 is an electron microscope photograph of microcones formed in the surface of the n-type semiconductor layer 22 by the process of this embodiment. It can be seen that the multiple micro-cones are substantially even in size and formed in the closest packed arrangement. That is, the multiple micro-cones are formed with almost no gaps, and there are almost no portions remaining as flat faces, and further it can be seen that the shapes of almost all micro-cones are kept to be a six-sided pyramid, which is advantageous in light extraction.

As obvious from the above description, multiple recesses 60 formed in the surface of the n-type semiconductor layer 22 function as etching control points. That is, because crystal planes relatively low in etching speed as compared with the C-plane are exposed in the inside walls of the recess 60, the etching progresses such that the formed points of the recesses 60 respectively become the apexes of multiple micro-cones. Thus, the arrangement of the multiple micro-cones 22a is according to the arrangement form of the recess 60. Because of their nature, the micro-cones 22a are formed to have such an orientation that two opposite sides of their bottom in a regular hexagon shape are parallel to the [1-100] direction of a crystal axis of the semiconductor film 20. In view of this fact, other recesses adjacent to any one recess are respectively placed at the vertexes of a regular hexagon, and the recesses are arranged at equal intervals such that two opposite sides of the regular hexagon are parallel to the [1-100] direction of a crystal axis of the semiconductor film 20, and thereby each of the micro-cones grows at substantially the same speed and comes into contact with adjacent micro-cones at substantially the same timing. Hence, multiple micro-cones that are substantially even in size, shape, and interval and form the closest packed arrangement along a crystal axis of the semiconductor film 20 can be formed. That is, multiple micro-cones are formed with no gaps, maintaining their six-sided pyramid shape, and no flat face remains in the light extraction surface. Thus, an ideal light extraction structure can be formed in the light extraction surface, so that the light extraction efficiency of the optical semiconductor element can be improved to a maximum degree. Further, because the micro-cones grow at substantially the same speed, a micro-cone of a size remarkably larger than the average size can be prevented from emerging. Thus, a through hole being formed in the semiconductor film 20 can be avoided in the wet etching process for forming micro-cones, and therefore the production yield can be improved as compared with the conventional process.

Embodiment 2

The manufacturing method of an optical semiconductor element according to Embodiment 2 of the present invention will be described below. The manufacturing method according to this embodiment differs from that of the above embodiment 1 in the process of forming a light extraction structure. More specifically, the arrangement form of multiple recesses 60 for defining the size and arrangement of micro-cones differs from that of the embodiment 1. The processes other than the process of forming a light extraction structure are the same as in the embodiment 1, and hence description thereof is omitted.

A wet etching process using an alkali solution is performed on the surface of the n-type semiconductor layer 22 exposed by removing the growth substrate 10 so as to form multiple micro-cones in the surface of the n-type semiconductor layer 22. By this means, a light extraction structure is formed in the surface of the n-type semiconductor layer 22. FIGS. 6A to 6D show the surface of the n-type semiconductor layer 22 that is a light extraction surface, and are plan views showing the formation process of micro-cones 22a in this production process.

Figure 6A:
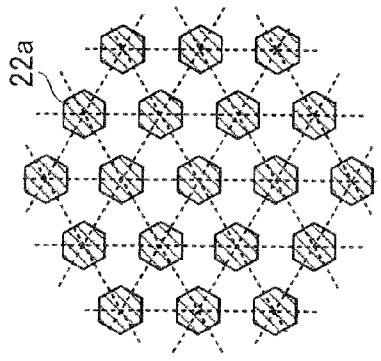
FIGS. 6A to 6D are plan views showing the formation process of micro-cones formed by the manufacturing method according to Embodiment 2 of the present invention.

A plurality of recesses 60 arranged at equal intervals along a crystal axis of the semiconductor film 20 are formed in the exposed surface (C-plane) of the n-type semiconductor layer 22 exposed by removing the growth substrate 10 (FIG. 6A). Each recess 60 functions as an etching control point in the subsequent wet etching process, and the plurality of micro-cones 22a will be arranged regularly according to the arrangement form of the recesses 60.

The preferable size and shape of the recesses 60 are the same as in the above embodiment 1. The arrangement form of the recesses 60 is as follows. That is, as shown in FIG. 6A, other recesses adjacent to any one recess are respectively placed at the vertexes of a regular hexagon, and the recesses 60 are arranged at equal intervals such that two opposite sides of the regular hexagon are parallel to the [11-20] direction of a crystal axis of the semiconductor film 20. In other words, the recesses 60 are arranged at equal intervals along the [11-20] direction of a crystal axis of the semiconductor film 20 and also at equal intervals along the [2-1-10] direction. This arrangement form corresponds to the one obtained by rotating the arrangement of the recesses 60 in Embodiment 1 through 90°.

The micro-cone 22a is shaped like a six-sided pyramid having a bottom in a substantially regular hexagon, and the length of a perpendicular line joining two opposite sides of the regular hexagon forming the bottom coincides with the arrangement interval (pitch) of the recesses 60. Hence, the arrangement interval (pitch) of the recesses 60 should be set according to the size of micro-cones to be formed. The interval (pitch) of the recesses 60 can be, for example, greater than or equal to 1.0 μm and less than or equal to 5.5 μm. If the interval (pitch) of the recesses 60 is greater than the wavelength of light emitted from the active layer 24, micro-cones of sizes advantageous in light extraction can be formed. Further, the micro-cone has a slope at an angle of about 62° relative to the C-plane, and the interval of the recesses 60 and the height of the micro-cones formed coincide substantially. Accordingly, the interval of the recesses 60 is set to be smaller than the thickness of the n-type semiconductor layer 22 so that a through hole reaching the active layer is not formed.

The plurality of recesses 60 can be formed by, for example, photolithography and dry etching. That is, after a resist mask having openings over the recess forming regions is formed on the surface of the n-type semiconductor layer 22, the n-type semiconductor layer 22 is etched via the above resist mask by reactive ion etching to form the recesses 60.

After the recesses 60 are formed, the wafer is immersed in an alkali solution such as TMAH (a tetramethylammonia solution) to wet etch the surface of the n-type semiconductor layer 22 that is the C-plane.

Figure 6B:
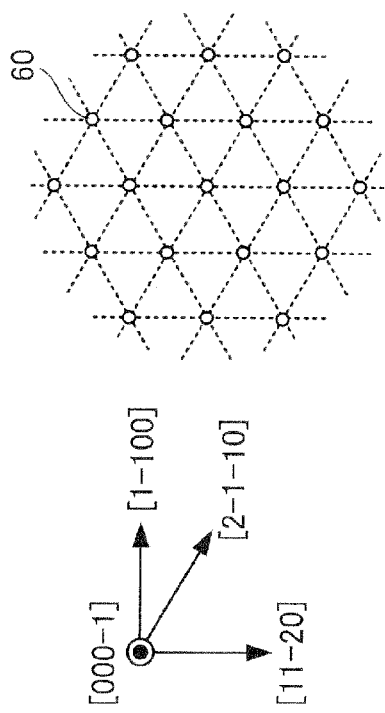

Each of the recesses 60 functions as an etching control point in this wet etching process. That is, various crystal planes are exposed in the inside walls of each recess 60. Hence, etching speed in each recess 60 is lower as compared with the C-plane exposed at the principal surface of the n-type semiconductor layer 22. Hence, the etching of the C-plane, where etching speed is relatively high, starts preferentially first and progresses making a predetermined crystal plane be exposed. By this means, multiple six-sided pyramid-shaped micro-cones 22a with the formed point of each recess 60 as the apex start to be formed in the surface of the n-type semiconductor layer 22. That is, the micro-cones 22a are formed being arranged according to the arrangement form of the recesses 60. Because of their nature, all micro-cones 22a are formed to have such an orientation that two opposite sides of their bottom in a regular hexagon shape are parallel to the [1-100] direction of a crystal axis of the semiconductor film 20 (FIG. 6B). By making the recesses 60 in a cylindrical, conical (mortar-like), or hemispherical shape, the difference in etching speed between the recesses 60 and their neighboring regions becomes remarkable, and thus the function of the recess 60 as an etching control point can be further improved.

Figure 6C:
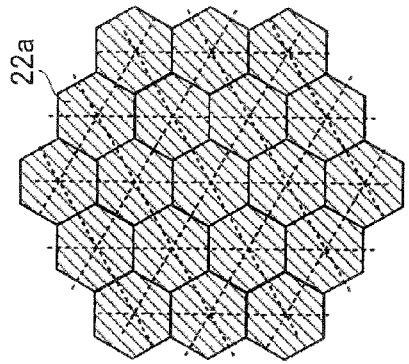

Each of the micro-cones 22a generated with the formed point of each recess 60 as the apex grows at substantially the same speed while the etching progresses (FIG. 6C).

Figure 6D:
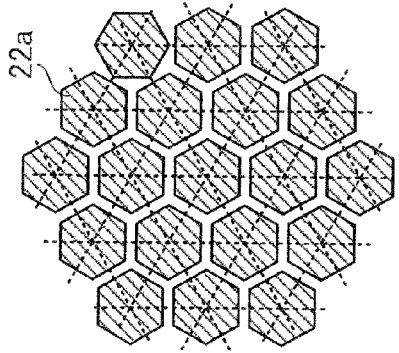

Because the micro-cones 22a are arranged at equal intervals according to the arrangement form of the recesses 60, the timing at which adjacent micro-cones come into contact with each other is substantially the same for the micro-cones. And, multiple micro-cones 22a of substantially the same size form the closest packed arrangement, fully covering the entire surface of the n-type semiconductor layer 22. That is, the micro-cones 22a are formed with almost no gaps, and there are almost no portions remaining as flat faces. Further, because the micro-cones do not encroach on each other, the six-sided pyramid shape is maintained until the end of the etching process (FIG. 6D). In the manufacturing method according to this embodiment, at the time point when adjacent micro-cones come into contact with each other, the closest packed arrangement is finished. At this time, the regular hexagon of the bottom of the micro-cone 22a has two sides parallel to the [1-100] direction.

As such, according to the manufacturing method of an optical semiconductor element in accordance with this embodiment, multiple micro-cones that are substantially even in size, shape, and interval and form the closest packed arrangement along a crystal axis of the semiconductor film 20 can be formed in the C-plane of the semiconductor film 20. Thus, an ideal light extraction structure can be formed in the light extraction surface of the semiconductor film 20, so that the light extraction efficiency of the optical semiconductor element can be improved to a maximum degree. Further, because the micro-cones grow at substantially the same speed, a micro-cone of a size remarkably larger than the average size can be prevented from emerging. Thus, a through hole being formed in the semiconductor film 20 can be avoided in the wet etching process for forming micro-cones, and therefore the production yield can be improved as compared with the conventional process.

Embodiment 3

The manufacturing method of an optical semiconductor element according to Embodiment 3 of the present invention will be described below with reference to FIGS. 7A to 7D. In the above embodiments, multiple recesses 60 in a predetermined arrangement form are formed by photolithography and dry etching in the surface (C-plane) of the n-type semiconductor layer 22 exposed by removing the growth substrate 10. This embodiment differs from the above embodiments in the process for forming multiple recesses 60.

Figure 7A:
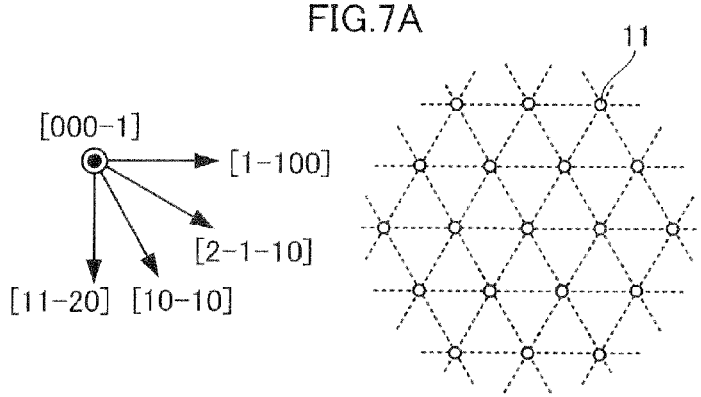
FIGS. 7A and 7B are plan views showing the crystal growth surface of a growth substrate according to an embodiment of the present invention.
Figure 7B:
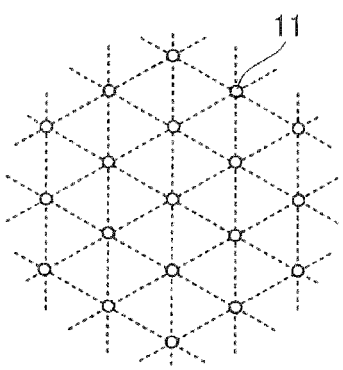

A growth substrate 10a is prepared which has multiple protrusions 11 forming an arrangement corresponding to the arrangement form of the recesses 60 shown in the above embodiments 1 and 2 on its crystal growth surface. FIGS. 7A and 7B are plan views showing the crystal growth surface of the growth substrate 10a according to this embodiment. With other protrusions adjacent to any one protrusion being respectively placed at the vertexes of a regular hexagon, the multiple protrusions 11 are arranged at equal intervals such that two opposite sides of the regular hexagon are parallel to the [1-100] direction (FIG. 7A) or [11-20] direction (FIG. 7B) of a crystal axis of the semiconductor film 20 later formed. In other words, the multiple protrusions 11 are placed being arranged at equal intervals along the [1-100] direction of a crystal axis of the semiconductor film 20 later formed and also at equal intervals along the [10-10] direction (FIG. 7A). Or, the multiple protrusions 11 are placed being arranged at equal intervals along the [11-20] direction of a crystal axis of the semiconductor film 20 later formed and also at equal intervals along the [2-1-10] direction (FIG. 7B).

The growth substrate 10a is, for example, a C-plane sapphire substrate, and the multiple protrusions 11 can be formed by, e.g., photolithography and dry etching. The shape of the protrusion 11 can be, for example, prismatic, pyramidal, cylindrical, conical, or hemispherical. As such, multiple protrusions 11, which can be described as the reverse in pattern of the recesses 60 shown in the above embodiments, are provided on the crystal growth surface of the growth substrate 10a.

Figure 7C:
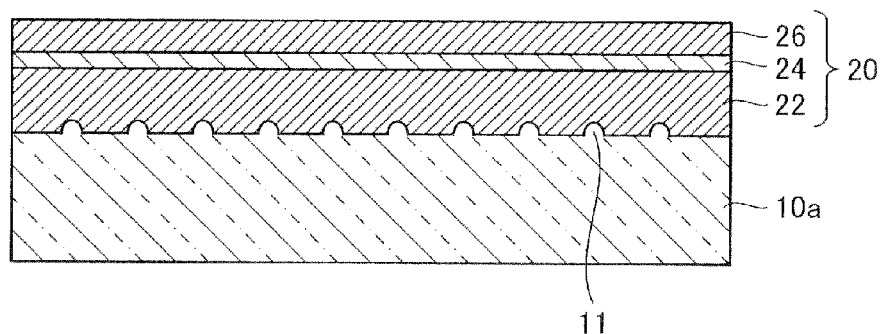
FIGS. 7C and 7D are cross-sectional views showing the manufacturing method of an optical semiconductor element according to the embodiment of the present invention.

Then, an n-type semiconductor layer 22, an active layer 24, and a p-type semiconductor layer 26 that are made of $Al_xIn_yGa_zN$ are sequentially crystal-grown one over another on the crystal growth surface of the growth substrate 10a having multiple protrusions 11 formed thereon by a metal organic chemical vapor deposition (MOCVD) method to obtain a semiconductor film 20 (FIG. 7C).

Figure 7D:
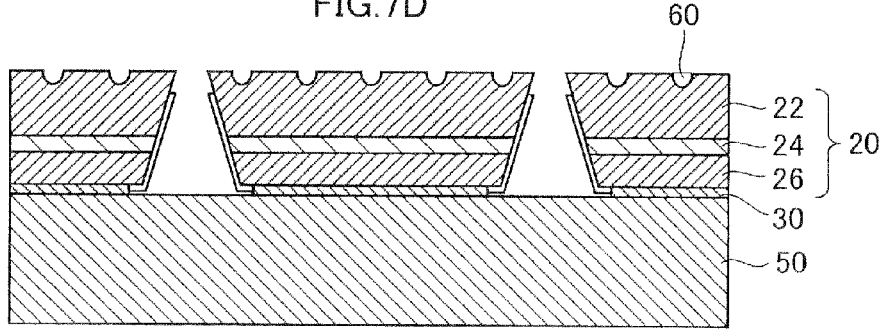

Subsequently, as in the previously-described embodiment 1, the formation process of element division grooves, the formation process of a protective film and p-electrodes, the bonding process of a support substrate, and the removal process of the growth substrate are performed. Multiple recesses 60 respectively corresponding to the multiple protrusions 11 provided on the crystal growth surface of the growth substrate 10a are formed in the surface of the n-type semiconductor layer 22 exposed by removing the growth substrate 10a. That is, the multiple recesses 60 are arranged corresponding to the arrangement form of the protrusions 11. This arrangement form of the recesses 60 is the same as in the above embodiments 1 and 2 (FIG. 7D).

Then, when a wet etching process using an alkali solution is performed, the recess 60 functions as an etching control point, so that micro-cones substantially even in size, shape, and interval that form the closest packed arrangement are formed in the surface of the n-type semiconductor layer 22. After the growth substrate 10a is removed, the n-type semiconductor layer 22 side of the semiconductor film 20 may be polished to adjust the diameter or depth of the recesses 60.

Although in the above embodiments description has been made taking as an example the case where the semiconductor film 20 is formed of a GaN-based semiconductor, another semiconductor having a crystal structure of the hexagonal system such as a ZnO-based semiconductor may be used.

This application is based on Japanese Patent Application No. 2011-048786 which is incorporated herein by reference.

What is claimed is:

1. A manufacturing method of an optical semiconductor element including a semiconductor film having a crystal structure of a hexagonal system, said manufacturing method including:

forming a plurality of recesses arranged at equal intervals along a crystal axis of said semiconductor film in a surface of said semiconductor film; and performing an etching process on the surface of said semiconductor film, to form a plurality of protrusions arranged according to an arrangement form of said plurality of recesses and deriving from the crystal structure of said semiconductor film in the surface of said semiconductor film;

wherein:

said plurality of recesses are arranged, with other recesses adjacent to any one recess being respectively placed at vertexes of a regular hexagon, such that two opposite sides of said regular hexagon are parallel to a [1-100] direction or [11-20] direction of a crystal axis of said semiconductor film;

said etching process comprises a wet etching process using a tetramethylammonium hydroxide solution, such that an etching speed in said recesses is lower as compared with an etching speed of a C-plane, and such that etching of the C-plane, the etching speed of which is relatively higher, starts preferentially first and progresses thereby exposing a predetermined crystal plane and forming, as the protrusions, multiple six-sided pyramid-shaped micro-cones with a formed point of each recess as an apex;

said plurality of protrusions are formed such that said plurality of protrusions have a closest packed arrangement; and the surface of said semiconductor film is the C-plane, and a plurality of crystal planes are exposed in inside walls of each of said plurality of recesses.

2. The manufacturing method according to claim 1, wherein a distance between adjacent ones of said recesses is greater than a wavelength of light emitted from said semiconductor film.

3. The manufacturing method according to claim 1, further including:

crystal-growing said semiconductor film on a growth substrate;

forming a support substrate on said semiconductor film; and removing said growth substrate;

wherein said plurality of recesses are formed by etching, via a mask, an exposed surface of said semiconductor film exposed by removing said growth substrate.

4. The manufacturing method according to claim 1, further including:

crystal-growing said semiconductor film on a growth substrate;

forming a support substrate on said semiconductor film; and removing said growth substrate;

wherein said growth substrate has a plurality of protrusions respectively corresponding to said plurality of recesses on its crystal growth surface, and said plurality of recesses are formed by crystal-growing said semiconductor film on said crystal growth surface of said growth substrate.

* * * * *